US011714942B2

(12) United States Patent
Cooper et al.

(10) Patent No.: US 11,714,942 B2
(45) Date of Patent: Aug. 1, 2023

(54) SHAPE MEMORY STORAGE FOR ELECTRICAL CIRCUIT AUTOROUTING

(71) Applicant: Frontier Design Automation, LLC, Austin, TX (US)

(72) Inventors: John Cooper, Scottsdale, AZ (US); Edward Gernert, Austin, TX (US)

(73) Assignee: FRONTIER DESIGN AUTOMATION, LLC, Austin, TX (US)

( * ) Notice: Subject to any disclaimer, the term of this patent is extended or adjusted under 35 U.S.C. 154(b) by 36 days.

(21) Appl. No.: 17/405,847

(22) Filed: Aug. 18, 2021

(65) Prior Publication Data

US 2022/0058324 A1 Feb. 24, 2022

Related U.S. Application Data

(60) Provisional application No. 63/067,023, filed on Aug. 18, 2020.

(51) Int. Cl.
*G06F 30/347* (2020.01)
*G06F 30/398* (2020.01)
*G06F 30/392* (2020.01)

(52) U.S. Cl.
CPC .......... *G06F 30/347* (2020.01); *G06F 30/392* (2020.01); *G06F 30/398* (2020.01)

(58) Field of Classification Search
CPC .............................. G06F 30/347; G06F 30/392
USPC ......................................................... 716/111
See application file for complete search history.

(56) References Cited

U.S. PATENT DOCUMENTS

| | | | |
|---|---|---|---|
| 8,473,891 B1 * | 6/2013 | Bosshart | G06F 30/394 716/139 |
| 10,783,292 B1 * | 9/2020 | Clewes | G06F 30/392 |
| 10,909,302 B1 * | 2/2021 | Ginetti | G06F 30/367 |
| 2013/0074023 A1 * | 3/2013 | Millendorf | G06F 30/33 716/112 |

* cited by examiner

*Primary Examiner* — Suchin Parihar
(74) *Attorney, Agent, or Firm* — Greenberg Traurig, LLP (57) ABSTRACT

A method to store the shapes of an electrical circuit design in a hierarchical set of arrays that inverts the layout size order by area includes defining a plurality of storage levels. Each level corresponds to a two-dimensional projection of the three-dimensional volume of the circuit layout. Accordingly, each level subsumes the entire physical space of the circuit layout. Each level may include a respective grid of slots. The slots may be rectangular. Each slot within any single level may be the same size and dimensions as every other slot in this level. Shapes are added to this storage technique based upon size, not based upon physical layer. Each slot can contain shapes from any physical layer as long as that shape fits entirely within the slot.

20 Claims, 8 Drawing Sheets
(4 of 8 Drawing Sheet(s) Filed in Color)

SHAPE MEMORY STORAGE FOR ELECTRICAL CIRCUIT AUTOROUTING

CROSS-REFERENCE TO RELATED APPLICATION

This application claims priority to U.S. provisional application No. 63/067,023 filed on Aug. 18, 2020, which is hereby incorporated by reference in its entirety.

TECHNICAL FIELD

This disclosure generally relates to storage and retrieval of shapes in computer memory for use in shape-based electrical circuit interconnect autorouting.

SUMMARY

In a first aspect of the present disclosure, a method for electronically storing shapes within a circuit design, the circuit being an integrated circuit or printed circuit board, is provided. The method includes defining a map structure with a plurality of storage levels, each storage level corresponding to an entire geometry of the circuit design, defining, for each storage level, a grid of storage slots, each storage slot corresponding to a respective portion of the geometry of the circuit design, each storage level having a different storage slot size than each other storage level, receiving a plurality of defined shapes within the circuit design, determining, for each of the plurality of shapes, a smallest of the storage slots into which the shape fits, and storing each of the plurality of shapes in memory in association with the determined smallest storage slot.

In an embodiment of the first aspect, each slot within one of the storage levels is the same size and shape as every other slot in that storage level.

In an embodiment of the first aspect, one of the storage levels consists of a single slot corresponding to the entire geometry of the circuit design.

In an embodiment of the first aspect, each slot within one of the storage levels does not overlap with any other slot in that storage level.

In an embodiment of the first aspect, each slot within one of the storage levels is rectangular.

In an embodiment of the first aspect, the method further includes receiving a request for one or more shapes within a geometric area of the circuit design, determining one or more storage slots at each storage level that at least partially overlap the geometric area, and returning, in response to the request, each shape within the determined one or more storage slots.

In an embodiment of the first aspect, determining the smallest of the storage slots into which a given shape fits includes testing the shape in progressively-larger slots until the shape fits into a tested slot.

In a second aspect of the present disclosure, a system is provided. The system includes a non-transitory, computer-readable memory storing instructions and a processor. The processor is configured to execute the instructions to electronically store shapes within a circuit design, the circuit being an integrated circuit or printed circuit board, by defining a map structure with a plurality of storage levels, each storage level corresponding to an entire geometry of the circuit design, defining, for each storage level, a grid of storage slots, each storage slot corresponding to a respective portion of the geometry of the circuit design, each storage level having a different storage slot size than each other storage level, receiving a plurality of defined shapes within the circuit design, determining, for each of the plurality of shapes, a smallest of the storage slots into which the shape fits, and storing each of the plurality of shapes in memory in association with the determined smallest storage slot.

In an embodiment of the second aspect, each slot within one of the storage levels is the same size and shape as every other slot in that storage level.

In an embodiment of the second aspect, one of the storage levels consists of a single slot corresponding to the entire geometry of the circuit design.

In an embodiment of the second aspect, each slot within one of the storage levels does not overlap with any other slot in that storage level.

In an embodiment of the second aspect, each slot within one of the storage levels is rectangular.

In an embodiment of the second aspect, the memory stores further instructions and the processor is configured to execute the further instructions to receive a request for one or more shapes within a geometric area of the circuit design, determine one or more storage slots at each storage level that at least partially overlap the geometric area, and return, in response to the request, each shape within the determined one or more storage slots.

In an embodiment of the second aspect, determining the smallest of the storage slots into which a given shape fits includes testing the shape in progressively-larger slots until the shape fits into a tested slot.

In a third aspect of the present disclosure, a non-transitory, computer-readable medium is provided. The medium stores instructions that, when executed by a processor, cause the processor to perform a method for electronically storing shapes within a circuit design, the circuit being an integrated circuit or printed circuit board. The method includes defining a map structure with a plurality of storage levels, each storage level corresponding to the entire geometry of the circuit design, defining, for each storage level, a grid of storage slots, each storage slot corresponding to a respective portion of the geometry of the circuit design, each storage level having a different storage slot size than each other storage level, receiving a plurality of defined shapes within the circuit design, determining, for each of the plurality of shapes, a smallest of the storage slots into which the shape fits, and storing each of the plurality of shapes in memory in association with the determined smallest storage slot.

In an embodiment of the third aspect, each slot within one of the storage levels is the same size and shape as every other slot in that storage level.

In an embodiment of the third aspect, one of the storage levels consists of a single slot corresponding to the entire geometry of the circuit design.

In an embodiment of the third aspect, each slot within one of the storage levels does not overlap with any other slot in that storage level.

In an embodiment of the third aspect, each slot within one of the storage levels is rectangular.

In an embodiment of the third aspect, the method further includes receiving a request for one or more shapes within a geometric area of the circuit design, determining one or more storage slots at each storage level that at least partially overlaps the geometric area, and returning, in response to the request, each shape within the determined one or more storage slots.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Most consumer electronics products today include at least one Printed Circuit Board (PCB). A PCB is designed as a series of copper paths and pads which are etched into the PC board during fabrication. The discrete components of a printed circuit board are soldered onto the PCB pad shapes. Copper interconnect shapes can be designed using multiple different object shapes that overlap that connect the copper pad shapes. These copper interconnect paths allow the electrical connectivity between components to create some logic designed by an engineer.

Shape objects are also used inside an Integrated Circuit (IC). Shape objects can be used to design discrete devices such as transistors, resistors, and capacitors. Shape objects in Integrated Circuits are typically made out of silicon. Using the silicon shape objects designers can create specialized logic designed by an engineer. Silicon interconnect shapes can be designed using multiple different object shapes that overlap and connect to the discrete devices. The silicon interconnect paths allow the electrical connectivity between the discrete devices to create some logic designed by an engineer.

Electronic Design Automation (EDA) companies are providers of software tools that support the development of next generation electronic hardware. An important EDA tool provided is a router of interconnect for PCB and IC designs that are used for practically every electronic product. It follows that customers want the most advanced routing tools and vendors want products to offer that will meet or exceed customer interconnect requirements.

Figure 1:
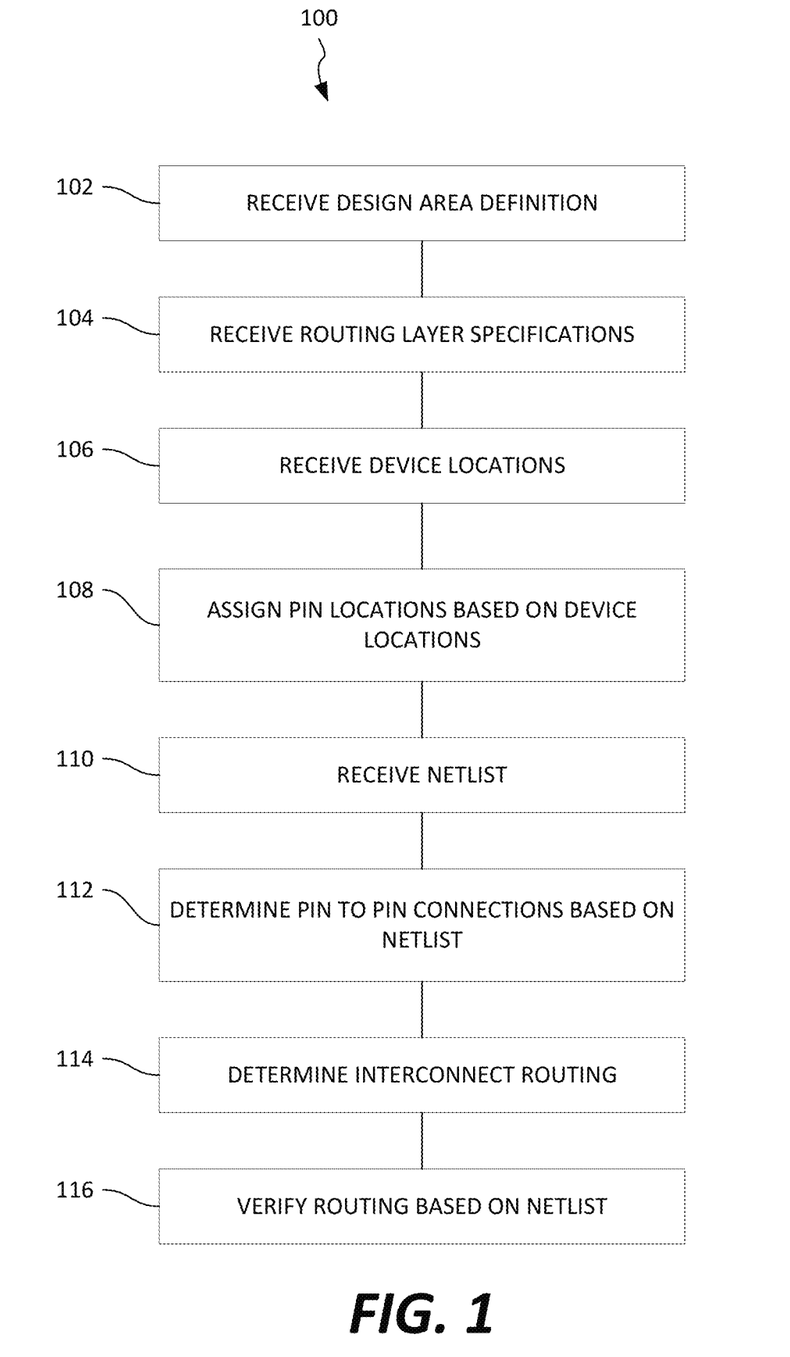
FIG. 1 is a flow chart illustrating an example shape-based autorouting process.

Referring to the figures, wherein like numerals refer to the same or similar features, FIG. 1 is a flow chart illustrating an example shape-based autorouting process 100. The process 100 includes various steps and information with which physical layout designers in the trade are familiar to perform interconnect routing and checking. One or more portions of the method 100 may be performed by an autorouting system (shown in FIG. 8), in some embodiments.

The method 100 may include, at block 102, receiving a specified scale and size of a circuit layout, which scale and size may include dimensions of the design area. Such dimensions may include a two-dimensional area per layer and number of layers, in some embodiments. Block 102 may further include receiving locations and dimensions of blockages are defined where routing is forbidden in the geometry of the circuit.

The method 100 may further include, at block 104, receiving a definition of each routing layer, including basic rules like wire width and spacing.

The method 100 may further include, at block 106, receiving locations of one or more devices (e.g., a plurality of devices) in the circuit design. Block 106 may include storing each device shape in a single respective slot within a level of a shape storage scheme according to the present disclosure. The information received at blocks 102, 104, and/or 106 may be received from a user (e.g., through circuit design software), in some embodiments.

The method 100 may further include, at block 108, assigning pin shapes and locations for each of the devices having locations received at block 106. As a result, the name and location of every pin and its shapes may be defined. Block 108 may include storing each pin shape in a respective slot of a level of a shape storage scheme according to the present disclosure.

The method 100 may further include, at block 110, receiving a netlist that specifies the net interconnect between pins and any special constraint rules that must be applied for certain nets. The netlist may be received from a user (e.g., through circuit design software), in some embodiments.

The method 100 may further include, at block 112, determining pin to pin connections, based on the received netlist, so that a routing interconnect topology is known and can be displayed graphically.

The method 100 may further include, at block 114, performing interconnect routing by creating path and via (interconnect between layers) shapes to complete continuity for every net. Block 114 may include storing each path shape and each via shape in a respective slot within a level of a shape storage scheme according to the present disclosure.

The method 100 may further include, at block 116, checking that every net is completely connected and correct with no shorts, opens, or any constraint violations. Block 116 may include, in some embodiments, recalling shapes from a shape storage scheme according to the present disclosure.

In summary, shapes are used to represent the layout of physical objects and also to satisfy the electrical characteristics of each geometric feature of the interconnect.

A challenging aspect of shape-based routing is that after all the placement and netlist data has been defined, a large number of shapes on multiple layers must be physically connected. For a small multilayer layout, the number of shapes to manage can be several hundred thousand and for the largest and most complex designs there may be multi-millions of shapes. As part of an automated routing or checking process, testing of shapes in an area or shapes against other shapes is performed a very large number of times. Accordingly, efficient storage of shapes in memory and efficient retrieval of shapes from memory improve the computational efficiency of automated routing and checking routines. The instant disclosure provides for more efficient storage, which in turn enables: storage of all the various shapes required for any physical layout; a capability to handle multilayer layouts; fast query lookup of shapes within a specified area; quick comparison of a shape versus nearby shapes; the ability to address advanced circuit interconnect rules and constraints; support for orthogonal, diagonal and any angle routing shapes.

This disclosure defines processes and strategies for hierarchical storage and retrieval of shapes that is efficient, uses less storage and has the capacity to handle very large layouts. A typical electronic layout has an architecture that is hierarchical in nature. First there is the layout area itself that contains different sized devices placed which might span multiple layers. Then there is the network interconnects which consists of varying length and width wire segments placed on multiple layers and then there is the small area multilayer pins and interlayer connect via shapes. In addition, there may be blockage shapes that define specific areas where network connections are forbidden.

A novel method to store the shapes of an electrical circuit design in a hierarchical set of arrays that inverts the layout size order by area generally includes defining a plurality of storage levels. Each level corresponds to a two-dimensional projection of the three-dimensional volume of the circuit layout. Accordingly, each level subsumes the entire physical space of the circuit layout, and is therefore distinct from a single layer of a typical layer-based bin storage scheme. Each level may include a respective grid of slots. The slots may be rectangular. Each slot within any single level normally will be the same size and dimensions as every other slot in this level. Shapes are added to this storage technique based upon size, not based upon layer. Each slot can contain shapes from any layer as long as that shape fits entirely within the slot.

A plurality of levels may be provided, from a base level array having smallest sized slots to a top-level array that normally has only one slot. The base level array has a large number of small equal sized slots for storing most of the smaller objects such as pins, interlayer connect vias and any short wire shapes, for example. If a shape bounding box area doesn't fit entirely in a slot at the first level, it is tested at the second level that has larger but fewer slots. If the shape area fits entirely in a slot at the 2nd level it is inserted in this slot. Otherwise, the shape is tested at the 3rd level and so on. In the worst case a large shape will migrate to the top level which will have one single slot that is the size of the entire circuit layout where it is always guaranteed to fit. An advantage of this method is that each shape is stored in one and only one slot, in contrast to typical storage methods in which a single shape may be stored in multiple bins (and may thus occupy additional memory and processing associated with each of those bins).

In operation, the storage processes and strategies disclosed herein may accept shapes that are defined by a user or by an autorouting program, determine how to store those shapes, store those shapes in memory, and retrieve the shapes from memory in response to requests (e.g., area-based searches) from the autorouting or checking program or from the user.

Normally, routing searches are done one layer at a time within a certain area. It may seem that the hierarchical storage method would be wasteful compared to a layered storage methodology. However, because each shape is stored only once and in only one slot, the amount of processing is reduced significantly such that the hierarchical method is at least as efficient as the layered method but requires significantly less storage.

Example Shapes Used In Shape-Based Autorouting and Checking. The geometric shapes that are typically used to build a layout design include Rectangles, Circles, Paths and Polygons. After the layout structure is defined, placement pins and netlist interconnect have been derived, the shapes to be managed are ready for the novel storage methodology of the instant disclosure to define a multi-level storage map, determine the correct level of the map based upon each shape's size, and store that shape in its appropriate level/slot.

Figure 2:
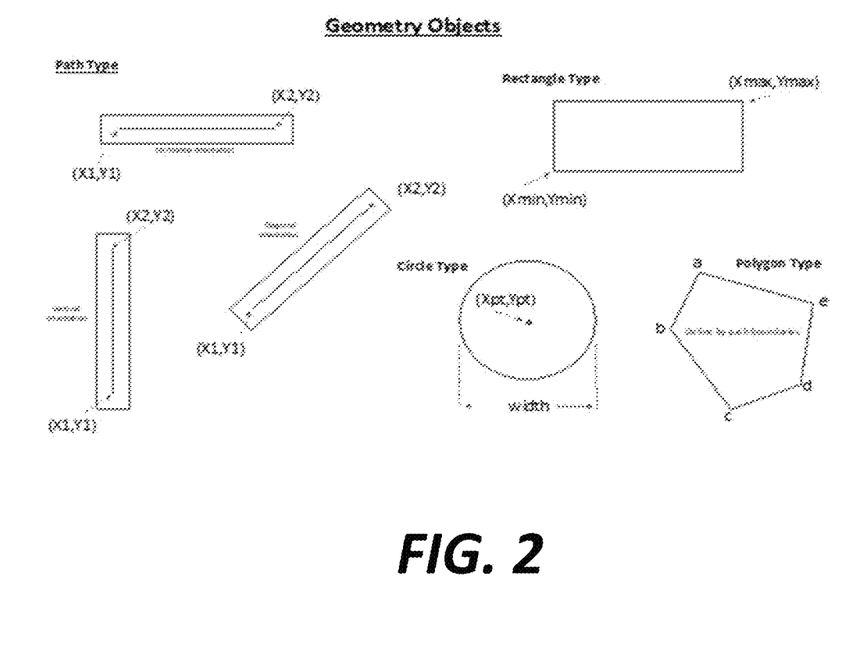
FIG. 2 illustrates a plurality of shapes that may be defined and used in a shape-based autorouting routine and stored in computer memory according to the teachings of the present disclosure.

FIG. 2 illustrates examples of a rectangle 202, a circle 204, paths 206, and a polygon 208, along with the parameters used to define each shape geometry, including its bounding box. The area a shape occupies is defined by its bounding box. Every shape will have a bounding box specified as this bounding box is used to ensure the shape fits into the proper level and slot within the map. Although rectangle, circle, path, and polygon are explicitly discussed herein, the shape storage methods are not limited to any particular shape or shapes. Instead, the shape storage methods of the instant disclosure may be applied to any definable shape.

Figure 3:
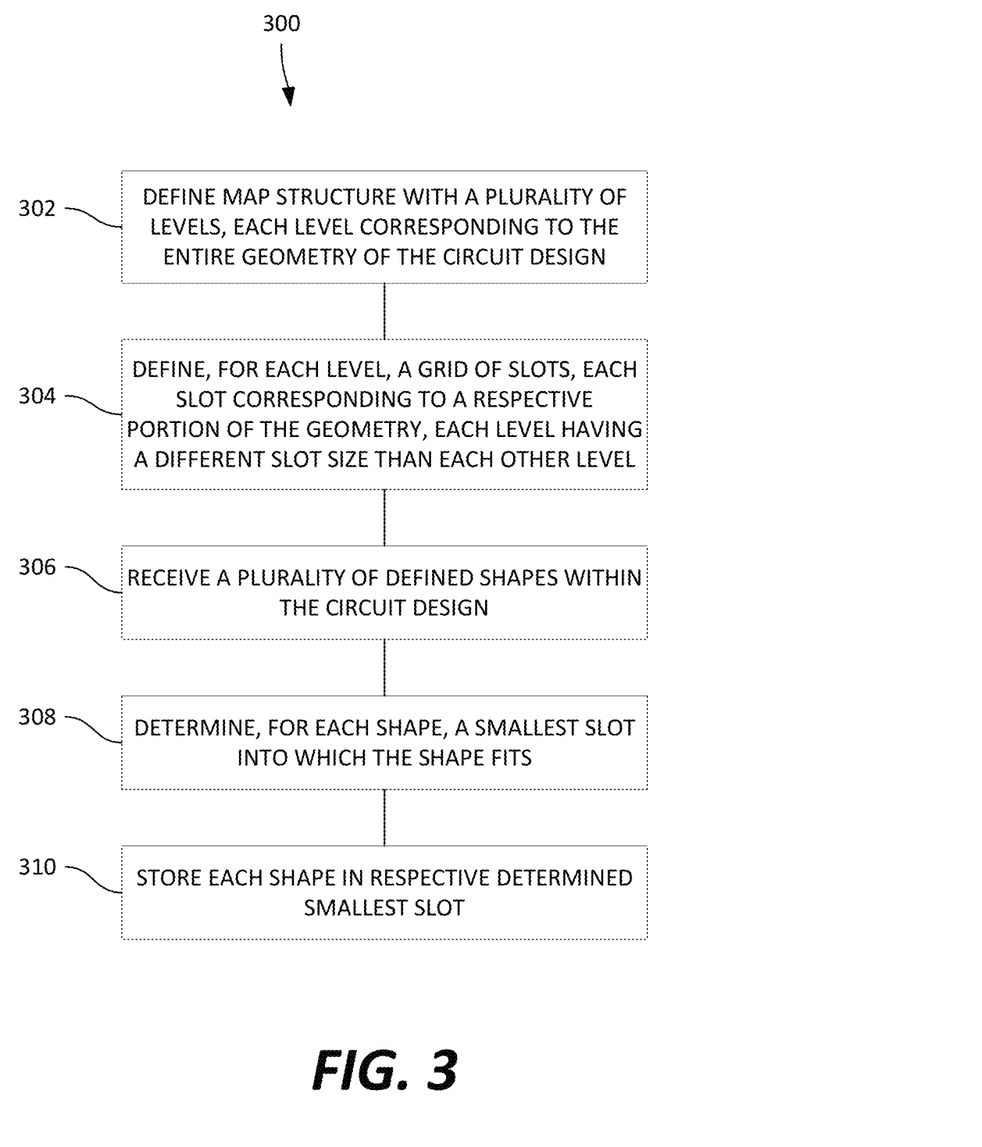
FIG. 3 is a flow chart illustrating an example method for electronically storing shapes within a circuit design.
Figure 4:
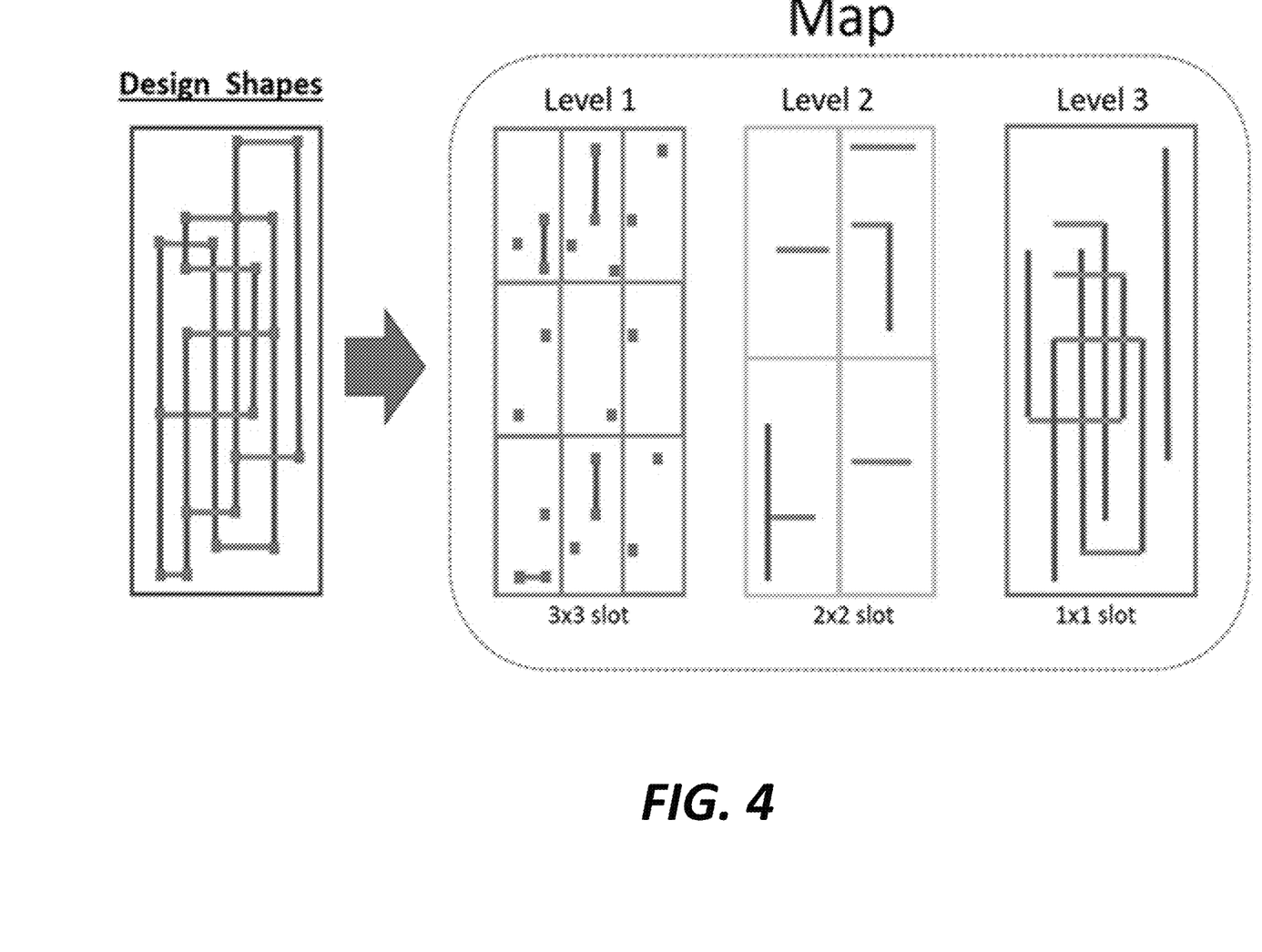
FIG. 4 is a diagram illustrating an example assignment of shapes in an electrical circuit layout to an improved multi-level storage map for shape storage in computer memory.

Storage of Shapes for Shape-Based Autorouting and Checking. FIG. 3 is a flow chart illustrating an example method 300 for electronically storing shapes within a circuit design. FIG. 4 illustrates various aspects of the method 300. FIGS. 3 and 4 illustrate a novel approach to shape storage that improves upon the typical layer bin-based approach that is illustrated in and will be described with respect to FIG. 7. FIG. 4 shows an example hierarchical map array 402 with three levels 404, 406, 408 of slots (not to be confused with layers) for a circuit 400. Each level 404, 406, 408 is built as an array of slots that covers the entire circuit 400. The number of slots at each level is derived from the design data with the objective of balancing the content of each level for efficient processing.

Referring to FIGS. 3 and 4, the method 300 may include, at block 302, defining a map structure with a plurality of levels, with each level corresponding to the entire geometry of the circuit design. For example, FIG. 4 illustrates a multi-layer design 402 with a plurality of shapes. Block 302 may include defining three levels 404, 406, 408, as shown in FIG. 4, each of which corresponds to the entire geometry of the design 402. That is, each level 404, 406, 408 may subsume the entire two-dimensional area of every layer of the circuit 402.

The method 300 may further include, at block 304, defining, for each level, a grid of slots, each slot corresponding to a respective portion of the geometry, each level having a different slot size from each other level. In the example of FIG. 4, the "lowest" level 404 includes a 3×3 grid of slots, for nine slots total; the next level 406 includes a 2×2 grid of slots, for four slots total; and the "highest" level 408 includes a single slot that subsumes the entire circuit design geometry. In some embodiments, such as the illustrated embodiment, each slot within a given level may have the same two-dimensional geometry (same width and length) as each other slot in that level. In some embodiments, such as the illustrated embodiment, a grid at a level may include the same number of rows and columns. In other embodiments, one or more levels may include a different number of rows from its number of columns. Because each level subsumes each layer of the circuit, each slot likewise may subsume each layer of the circuit within the two-dimensional area of the slot.

In the example of FIG. 4, Level 1 (i.e., lowest level 404) is designed to hold small object shapes such as pins, interlayer interconnect vias, and short path segments. The size of each slot in the first level 404 is about eight times the size of the average pin size. This oversizing is enough to allow most small shapes to fit completely within a Level 1 slot. As will be discussed below, if a shape doesn't fit at Level 1, it will be tried at Level 2, which has slots that are larger than Level 1. If the shape fits completely within this slot, it will be stored at Level 2. This process continues at each level until the last (or top) level is reached that has a single slot that covers the entire Layout where any shape is guaranteed to fit. Although the example of FIG. 4 includes three levels, any number of levels may be derived as appropriate for the shapes of a given circuit layout.

The method 300 may further include, at block 306, receiving a plurality of defined shapes within the circuit design. As discussed with respect to FIG. 1, some shapes, such as device shapes, may be received from a user (e.g., via circuit design software or otherwise at block 106). Other shapes, such as paths and vias, may be received from a shape expansion routine within the autorouting program (e.g., as discussed with respect to block 114).

In some embodiments, some defined shapes may be received before performance of block 306. For example, in some embodiments, the defined shapes of devices may be received and, based on the quantity, size, and/or distribution of devices, the overall design area, and/or the constraints in the design, the number of levels and number and size of slots at each level may be defined.

The method 300 may further include, at block 308, determining, for each shape, a smallest slot into which the shape fits. In some embodiments, block 308 may include iteratively testing the shape in progressively-larger slot levels. If a shape crosses a boundary of a slot, it may be considered to not fit into that slot. On the other hand, if the entirety of a shape lies inside of the boundary of a slot on all four sides, it may be considered to fit within that slot.

As an example of block 308, consider path 410. Path 410 may first be tested at lowest level 404, but path 410 would cross boundaries of the three slots in the right-most column, and therefore does not fit into a slot at lowest level 404. Path 410 may then be tested at middle level 406, but path 410 would cross boundaries of the two slots in the right column, and therefore does not fit into a slot at middle level 406. Because highest level 408 includes a single slot that covers the entire geometry, path 410 fits into the single slot.

The method 300 may further include, at block 310 storing each shape into the respective determined smallest slot into which it fits. Each shape may therefore be stored a single time, in the smallest slot into which it fits.

Figure 5:
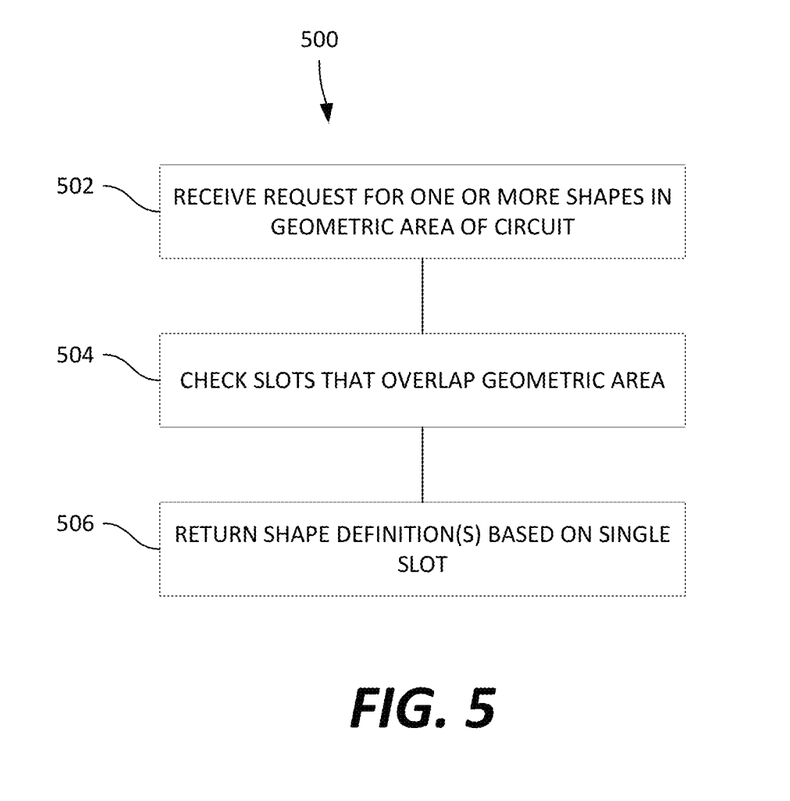
FIG. 5 is a flow chart illustrating an example method of retrieving shapes from memory.
Figure 6:
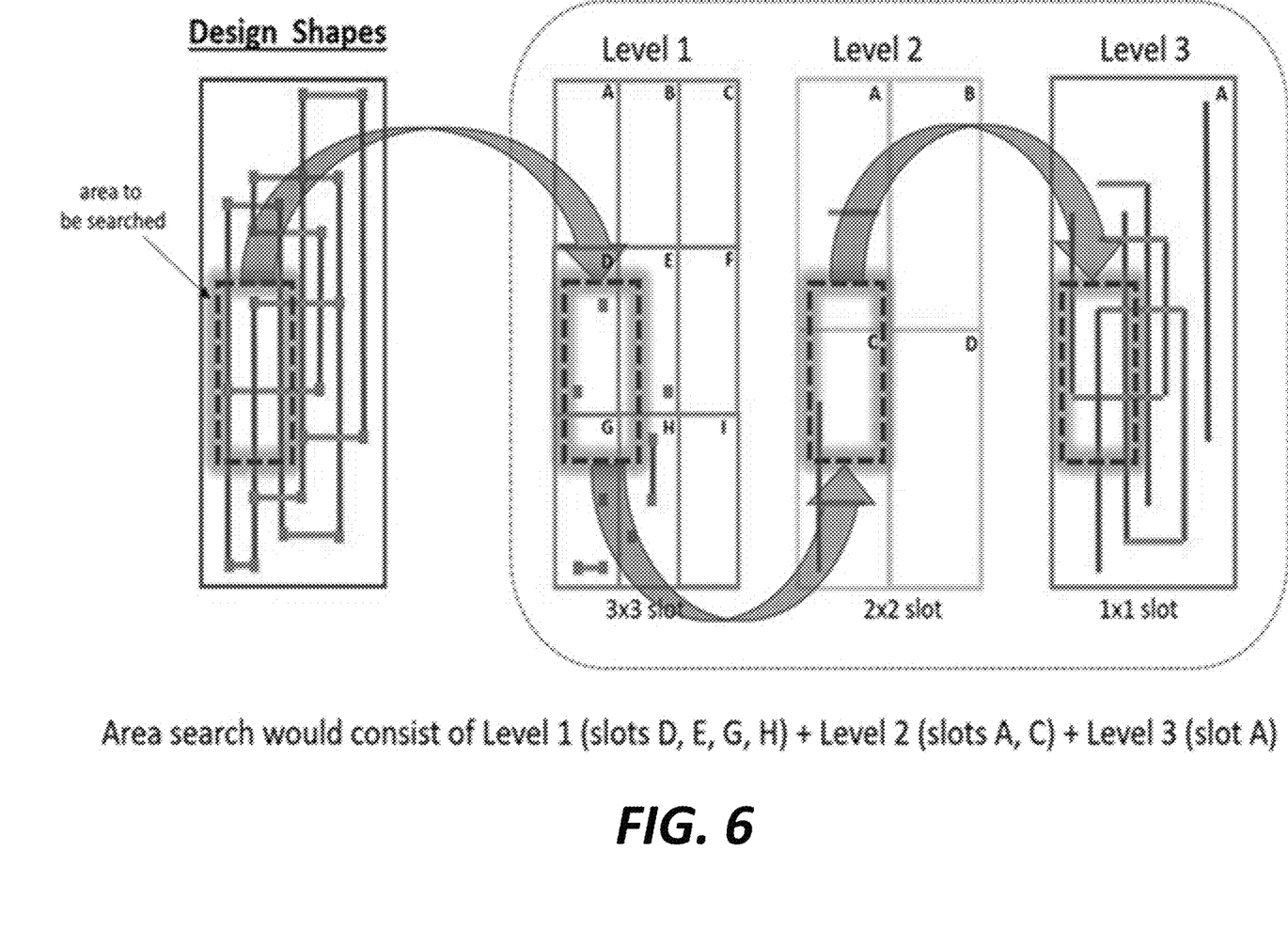
FIG. 6 is a diagram illustrating an example use of a multi-level storage map in response to an area-based search query.

Use of Stored Shapes. After the map structure has been built, its main uses are to support drawing graphics and doing area searches to support shape-based routing and checking algorithms. For graphics, the window area to draw is input as a search window and the resulting returned shapes are used to draw the graphics. For routing, the area of interest is input as the search rectangle and the shapes within this area are returned to support the ongoing interconnect or checking process. FIG. 5 is a flow chart illustrating an example method of retrieving shapes from memory. FIG. 6 illustrates a small design that will be referenced to explain how a search area is used to acquire shapes from the map for the purpose of routing or checking. In short, in response to a shape lookup, the search area is matched against the slots at each level and shapes within the intersected slots are returned. The small design area shown in FIG. 6 illustrates how the search gets the shapes from the slots within the lookup area. On a large design there may be multiple levels and hundreds of slots to process in a large area but the overall search mechanism is the same.

The method 500 may include, at block 502, receiving a request for one or more shapes in a geometric area of a circuit. The request may be, for example, an area-based search in which the user requests each shape within a defined projected two-dimensional area of the circuit. An example search area 602 is illustrated in FIG. 6.

The method 500 may further include, at block 504, checking slots containing the determined location (e.g., determining one or more slots that at least partially overlap a search area 602) and, at block 506, returning the definition of one or more shapes within the checked slot(s). Because shapes are stored in only a single slot, an entire shape definition may be returned by referencing only a single slot for that given shape. That is, determining and returning information respective of a shape (e.g., a multi-layer via) does not require referencing multiple different memory portions dedicated to separate physical circuit layers, for example. For example, as shown in FIG. 6, slots including any portion of the area 602 that is the subject of the area search are checked at each level 404 (four slots De, E, G, and H) overlapping with search area), 406 (two slots A and C), 408 (one slot A), and one or more of (e.g., all of) the shapes in those slots are returned.

Figure 7:
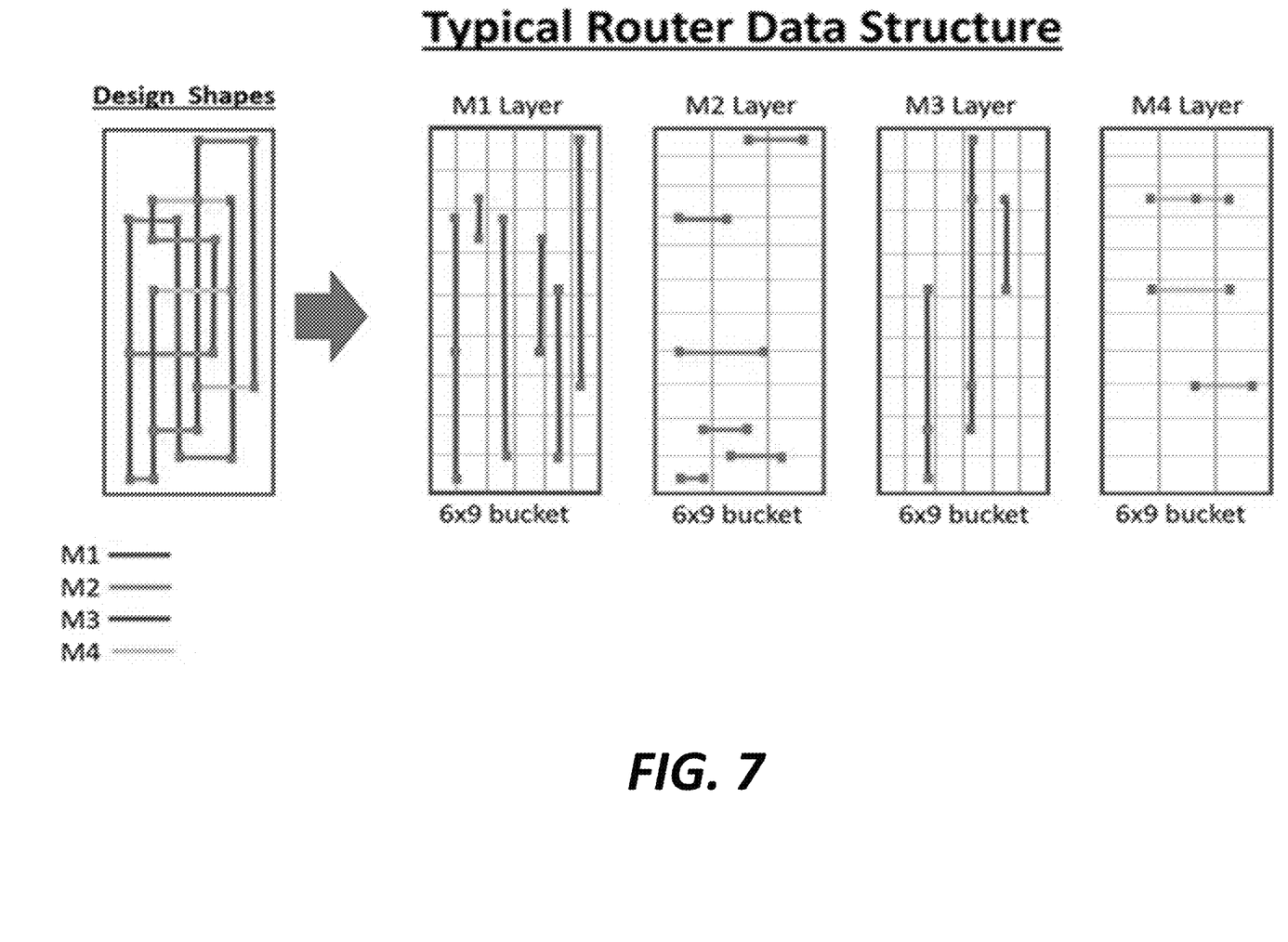
FIG. 7 is diagram illustrating an example assignment of shapes in a typical electrical circuit layout to a layer-by-layer bin structure for shape storage in computer memory.

Typical Router Data Structure. FIG. 7 shows how shapes might be stored in a typical router data structure using an array of bins, using circuit 400 as an example. These bin structures are built by layer M1, M2, M3, M4 and are used to store the shape data by physical layer. A large shape placed inside this bin structure would require multiple bins to hold the shape's data location. In contrast, the new hierarchical storing method disclosed herein stores the shapes by slots. Each shape, regardless of its layer or size, is only stored within one slot and one slot only. On a large multi-layer layout, the traditional bin method illustrated in FIG. 7 uses significantly more storage and requires more processing time than the storage methodology of this disclosure.

The typical method of storing shapes for autorouting includes storing the shapes flat using bins by physical layer as shown in FIG. 7. Normally the bin shape is not square but a rectangle. The typical layout design storage mechanism is broken into thousands of small rectangular bins which exist on every layer. Traditional storage of any given shape can exist in multiple bins at the same time. Every bin consumes memory to point to the shapes that are contained within the bin. Thus, any large shape spanning multiple bins can consume extra memory just pointing to the same shape. On any design, any large shape can occupy hundreds or more bins which contrasts sharply with the method described in the disclosure.

Figure 8:
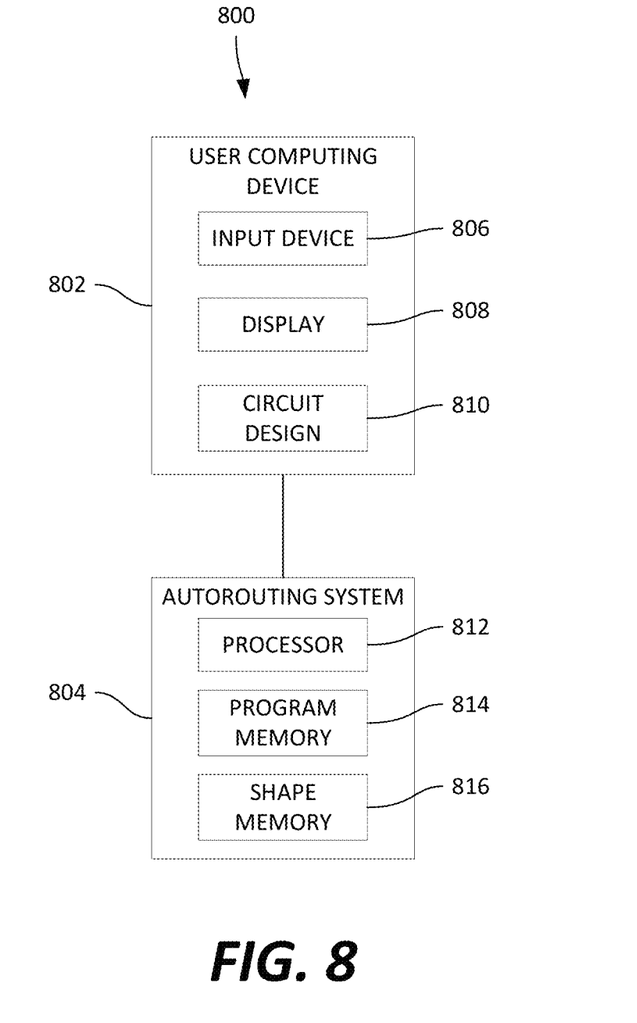
FIG. 8 is a diagrammatic view of an example system for electronically storing shapes within a circuit design.

FIG. 8 is a diagrammatic view of a system 800 for circuit autorouting and shape storage. The system may include a user computing device 802 and an autorouting system 804. The user computing device 802 may be in electronic communication with the autorouting system 804. In some embodiments, the autorouting system 804 may be provided on the user computing device 802. In other embodiments, the autorouting system 804 may be provided as a service or otherwise on separate computing resources from the user computing device 802, and the user computing device 802 may communicate with the autorouting system over one or more networks.

The user computing device 802 may include one or more input devices 806 through which a user may enter circuit information, such as device information and locations, a netlist, etc. The user computing device 802 may further include a display 808 on which a circuit design may be displayed for the user. The user computing device 802 may further include a circuit design program 810, with which a user may design an IC, such as its overall dimensions and physical layers, the locations and definitions of discrete devices, etc., routing rules, and the like. The user computing device may communicate such circuit design information to the autorouting system 804.

The autorouting system 804 may include a processor 812 and a non-transitory, computer-readable program memory 814 storing instructions. The processor 812 may execute the instructions stored in the program memory 814, and the execution of such instructions may cause the processor 812 to perform one or more of the steps, methods, processes, etc. of this disclosure for autorouting and/or shape storage. The autorouting system 804 may further include a shape memory 816. The shape memory 816 may include a portion of a non-transitory storage medium, such as a cloud server, hard drive, flash memory, etc. The autorouting system may define respective memory portions in the shape memory for each of a plurality of slots of each of a plurality of levels, as disclosed herein, such that each of a plurality of shapes in a circuit design received from the user computing device 802 is stored once in the shape memory 816.

While this disclosure has described certain embodiments, it will be understood that the claims are not intended to be limited to these embodiments except as explicitly recited in the claims. On the contrary, the instant disclosure is intended to cover alternatives, modifications and equivalents, which may be included within the spirit and scope of the disclosure. Furthermore, in the detailed description of the present disclosure, numerous specific details are set forth in order to provide a thorough understanding of the disclosed embodiments. However, it will be obvious to one of ordinary skill in the art that systems and methods consistent with this disclosure may be practiced without these specific details. In other instances, well known methods, procedures, components, and circuits have not been described in detail as not to unnecessarily obscure various aspects of the present disclosure.

What is claimed is:

1. A method for electronically storing shapes within a circuit design, the circuit being an integrated circuit or printed circuit board, the method comprising:
    defining a map structure for a circuit design, the circuit design defining a geometry, the geometry comprising a plurality of physical layers, each physical layer having a respective two-dimensional area, the map structure comprising a plurality of storage levels, each storage level subsuming the two-dimensional areas of all of the physical layers;
    defining, for each storage level, a grid of storage slots, each storage slot corresponding to a respective portion of the geometry of the circuit design, each storage level having a different storage slot size than each other storage level;
    receiving a plurality of defined shapes within the circuit design;
    determining, for each of the plurality of shapes, a smallest of the storage slots into which the shape fits; and
    storing each of the plurality of shapes in memory in association with the determined smallest storage slot.

2. The method of claim 1, wherein each slot within one of the storage levels is the same size and shape as every other slot in that storage level.

3. The method of claim 1, wherein one of the storage levels consists of a single slot corresponding to the entire geometry of the circuit design.

4. The method of claim 1, wherein each slot within one of the storage levels does not overlap with any other slot in that storage level.

5. The method of claim 1, wherein each slot within one of the storage levels is rectangular.

6. The method of claim 1, further comprising:
    receiving a request for one or more shapes within a geometric area of the circuit design;
    determining one or more storage slots at each storage level that at least partially overlap the geometric area; and
    returning, in response to the request, each shape within the determined one or more storage slots.

7. The method of claim 1, wherein determining the smallest of the storage slots into which a given shape fits comprises testing the shape in progressively-larger slots until the shape fits into a tested slot.

8. A system comprising:
    a non-transitory, computer-readable memory storing instructions; and
    a processor configured to execute the instructions to electronically store shapes within a circuit design, the circuit being an integrated circuit or printed circuit board, by:
        defining a map structure for a circuit design, the circuit design defining a geometry, the geometry comprising a plurality of physical layers, each physical layer having a respective two-dimensional area, the map structure comprising a plurality of storage levels, each storage level subsuming the two-dimensional areas of all of the physical layers;
        defining, for each storage level, a grid of storage slots, each storage slot corresponding to a respective portion of the geometry of the circuit design, each storage level having a different storage slot size than each other storage level;
        receiving a plurality of defined shapes within the circuit design;
        determining, for each of the plurality of shapes, a smallest of the storage slots into which the shape fits; and
        storing each of the plurality of shapes in memory in association with the determined smallest storage slot.

9. The system of claim 8, wherein each slot within one of the storage levels is the same size and shape as every other slot in that storage level.

10. The system of claim 8, wherein one of the storage levels consists of a single slot corresponding to the entire geometry of the circuit design.

11. The system of claim 8, wherein each slot within one of the storage levels does not overlap with any other slot in that storage level.

12. The system of claim 8, wherein each slot within one of the storage levels is rectangular.

13. The system of claim 8, wherein the memory stores further instructions and the processor is configured to execute the further instructions to:
    receive a request for one or more shapes within a geometric area of the circuit design;
    determine one or more storage slots at each storage level that at least partially overlap the geometric area; and
    return, in response to the request, each shape within the determined one or more storage slots.

14. The system of claim 8, wherein determining the smallest of the storage slots into which a given shape fits comprises testing the shape in progressively-larger slots until the shape fits into a tested slot.

15. A non-transitory, computer-readable medium storing instructions that, when executed by a processor, cause the processor to perform a method for electronically storing shapes within a circuit design, the circuit being an integrated circuit or printed circuit board, the method comprising:

defining a map structure for a circuit design, the circuit design defining a geometry, the geometry comprising a plurality of physical layers, each physical layer having a respective two-dimensional area, the map structure comprising a plurality of storage levels, each storage level subsuming the two-dimensional areas of all of the physical layers;

defining, for each storage level, a grid of storage slots, each storage slot corresponding to a respective portion of the geometry of the circuit design, each storage level having a different storage slot size than each other storage level;

receiving a plurality of defined shapes within the circuit design;

determining, for each of the plurality of shapes, a smallest of the storage slots into which the shape fits; and     storing each of the plurality of shapes in memory in association with the determined smallest storage slot.

16. The non-transitory, computer-readable medium of claim 15, wherein each slot within one of the storage levels is the same size and shape as every other slot in that storage level.

17. The non-transitory, computer-readable medium of claim 15, wherein one of the storage levels consists of a single slot corresponding to the entire geometry of the circuit design.

18. The non-transitory, computer-readable medium of claim 15, wherein each slot within one of the storage levels does not overlap with any other slot in that storage level.

19. The non-transitory, computer-readable medium of claim 15, wherein each slot within one of the storage levels is rectangular.

20. The non-transitory, computer-readable medium of claim 15, wherein the method further comprises:

receiving a request for one or more shapes within a geometric area of the circuit design;

determining one or more storage slots at each storage level that at least partially overlaps the geometric area; and     returning, in response to the request, each shape within the determined one or more storage slots.

\* \* \* \* \*